United States Patent
Miura et al.

(10) Patent No.: US 11,252,845 B2
(45) Date of Patent: Feb. 15, 2022

(54) POWER CONVERSION DEVICE

(71) Applicant: DENSO CORPORATION, Kariya (JP)

(72) Inventors: Tomoya Miura, Kariya (JP); Kenshiro Hida, Kariya (JP); Hiroyoshi Sawada, Kariya (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 16/851,234

(22) Filed: Apr. 17, 2020

(65) Prior Publication Data

US 2020/0245496 A1 Jul. 30, 2020

Related U.S. Application Data

(63) Continuation of application No. PCT/JP2018/038443, filed on Oct. 16, 2018.

(30) Foreign Application Priority Data

Oct. 17, 2017 (JP) .............................. JP2017-201305

(51) Int. Cl.
*H05K 7/20* (2006.01)
*H02B 1/56* (2006.01)
*B60L 53/22* (2019.01)
*H02M 7/00* (2006.01)

(52) U.S. Cl.
CPC ............ *H05K 7/2089* (2013.01); *B60L 53/22* (2019.02); *H02B 1/565* (2013.01); *H02M 7/003* (2013.01)

(58) Field of Classification Search
None
See application file for complete search history.

(56) References Cited

U.S. PATENT DOCUMENTS

| | | | | |
|---|---|---|---|---|
| 4,041,241 A | * | 8/1977 | Olmstead | H01B 17/308 174/153 G |
| 6,936,770 B2 | * | 8/2005 | Takedomi | F16L 5/10 16/2.1 |
| 7,876,561 B2 | * | 1/2011 | Schnetzka | H02P 29/50 361/699 |
| 9,307,681 B2 | * | 4/2016 | Kogure | H05K 7/20927 |
| 10,147,667 B2 | * | 12/2018 | Tomita | H01L 21/4803 |
| 10,608,548 B2 | * | 3/2020 | Harada | B60L 50/51 |

(Continued)

FOREIGN PATENT DOCUMENTS

JP 2011-233794 A 11/2011

*Primary Examiner* — Courtney L Smith
(74) *Attorney, Agent, or Firm* — Oliff PLC (57) ABSTRACT

A power conversion device includes an electronic component, a cooler, a housing, protruding pipes, and annular seal members. Each of the seal members includes a seal body portion interposed between a corresponding one of the protruding pipes and the housing, and a flange portion extending outward from the seal body portion in a radial direction and contacting an outer surface of the housing from an axial direction. The housing includes a peripheral wall surface formed to surround the flange portion from an outer peripheral side, and an annular groove portion formed along an outer peripheral edge of the flange portion inside the peripheral wall surface. The peripheral wall surface is formed to extend outward, in the axial direction, from an axial contact surface of the housing contacted by the flange portion.

5 Claims, 8 Drawing Sheets

(56) References Cited

U.S. PATENT DOCUMENTS

| | | | |
|---|---|---|---|
| 2011/0194246 A1* | 8/2011 | Nakasaka | H05K 7/20927 |
| | | | 361/688 |
| 2013/0335918 A1* | 12/2013 | Tachibana | H05K 5/0213 |
| | | | 361/689 |
| 2015/0152987 A1* | 6/2015 | Ishikawa | B60H 1/00271 |
| | | | 285/350 |
| 2017/0067589 A1* | 3/2017 | Ishikawa | F28F 9/26 |
| 2018/0098457 A1* | 4/2018 | Takeuchi | H01L 23/4012 |
| 2019/0208672 A1* | 7/2019 | Yamabe | H02M 7/48 |

* cited by examiner

POWER CONVERSION DEVICE

CROSS REFERENCE OF RELATED APPLICATION

This application is the U.S. bypass application of International Application No. PCT/JP2018/038443 filed Oct. 16, 2018 which designated the U.S. and claims priority to Japanese Patent Application No. 2017-201305, filed Oct. 17, 2017, the contents of both of which are incorporated herein by reference.

TECHNICAL FIELD

The present disclosure relates to a power conversion device with a cooler.

BACKGROUND

For example, vehicles such as electric vehicles and hybrid cars are equipped with a power conversion device such as an inverter or a DC-DC converter. Such a power conversion device is disclosed in JP 2011-233794 A, for example, and the power conversion device in JP 2011-233794 A includes an electronic component such as a semiconductor module and a cooler that cools the electronic component, the electronic component and the cooler being housed in a housing. The power conversion device includes a refrigerant inlet pipe and a refrigerant outlet pipe both connected to the cooler and disposed protruding from the housing. At a penetrating portion where the refrigerant inlet pipe and the refrigerant outlet pipe penetrate the housing, grommets are disposed to provide watertightness between the housing and each of the refrigerant inlet pipe and the refrigerant outlet pipe.

SUMMARY

An aspect of the present disclosure is a power conversion device including an electronic component forming a part of a power conversion device, a cooler cooling the electronic component, a housing internally accommodating the electronic component and the cooler, a protruding pipe connected to the cooler and protruding outward from the housing, and an annular seal member sealing a gap between the protruding pipe and the housing.

The seal member includes a seal body portion interposed between the protruding pipe and the housing, and a flange portion extending outward from the seal body portion in a radial direction and contacting an outer surface of the housing from an axial direction.

The housing includes a peripheral wall surface formed surrounding the flange portion from an outer peripheral side and an annular groove portion formed along an outer peripheral edge of the flange portion inside the peripheral wall surface.

The peripheral wall surface is formed to extend outward from an outer peripheral end of an axial contact surface of the housing in the axial direction, the axial contact surface being contacted by the flange portion of the housing.

BRIEF DESCRIPTION OF THE DRAWINGS

The above-described features of the present disclosure will be clearer based on the following detailed description with reference to the accompanied drawings. In the accompanying drawings.

DETAILED DESCRIPTION OF THE PREFERRED EMBODIMENTS

In the power conversion device disclosed in JP 2011-233794 A, the grommets protrude from an outer surface of the housing. Thus, an interface between an outer peripheral edge of each of the grommets and the housing is likely to be wetted with water. In other words, for example, during car wash, rainfall, or the like, water may impinge on the interface between the outer peripheral edge of each of the grommet and the housing. Additionally, salt water or the like accumulated at the interface may be a factor gradually corroding the housing which is made of metal. The corroded housing may hinder that portion from being kept watertight.

An object of the present disclosure is to provide a power conversion device that can improve watertightness of the housing.

An aspect of the present disclosure is a power conversion device including an electronic component forming a part of a power conversion device, a cooler cooling the electronic component, a housing internally accommodating the electronic component and the cooler, a protruding pipe connected to the cooler and protruding outward from the housing, and an annular seal member sealing a gap between the protruding pipe and the housing.

The seal member includes a seal body portion interposed between the protruding pipe and the housing, and a flange portion extending outward from the seal body portion in a radial direction and contacting an outer surface of the housing from an axial direction.

The housing includes a peripheral wall surface formed surrounding the flange portion from an outer peripheral side and an annular groove portion formed along an outer peripheral edge of the flange portion inside the peripheral wall surface.

The peripheral wall surface is formed to extend outward from an outer peripheral end of an axial contact surface of the housing in the axial direction, the axial contact surface being contacted by the flange portion of the housing.

In the power conversion device, the housing includes the peripheral wall surface formed to surround the flange portion from the outer peripheral side. Thus, when the power conversion device is externally wetted with water, the vicinity of a contact portion between the flange portion of the seal member and the housing can be inhibited from being wetted with water. In other words, the outer peripheral end of the axial contact surface can be inhibited from being wetted with water.

Additionally, the housing includes the annular groove portion formed along the outer peripheral edge of the flange portion inside the peripheral wall surface. Thus, even in a case where water reaches the inside of the peripheral wall surface, the water can be inhibited from being accumulated at the outer peripheral end of the axial contact surface. In other words, when the water reaches the outer peripheral end of the axial contact surface, the water can be captured by the annular groove portion. As a result, the water is less likely to be accumulated at the outer peripheral edge of the flange portion.

Accordingly, the water can be effectively inhibited from infiltrating between the flange portion and the housing. In other words, watertightness of the housing can be improved.

As described above, according to the above-described aspect, a power conversion device can be provided that can improve watertightness of the housing.

First Embodiment

An embodiment related to a power conversion device will be described with reference to FIGS. 1 to 6.

Figure 1:
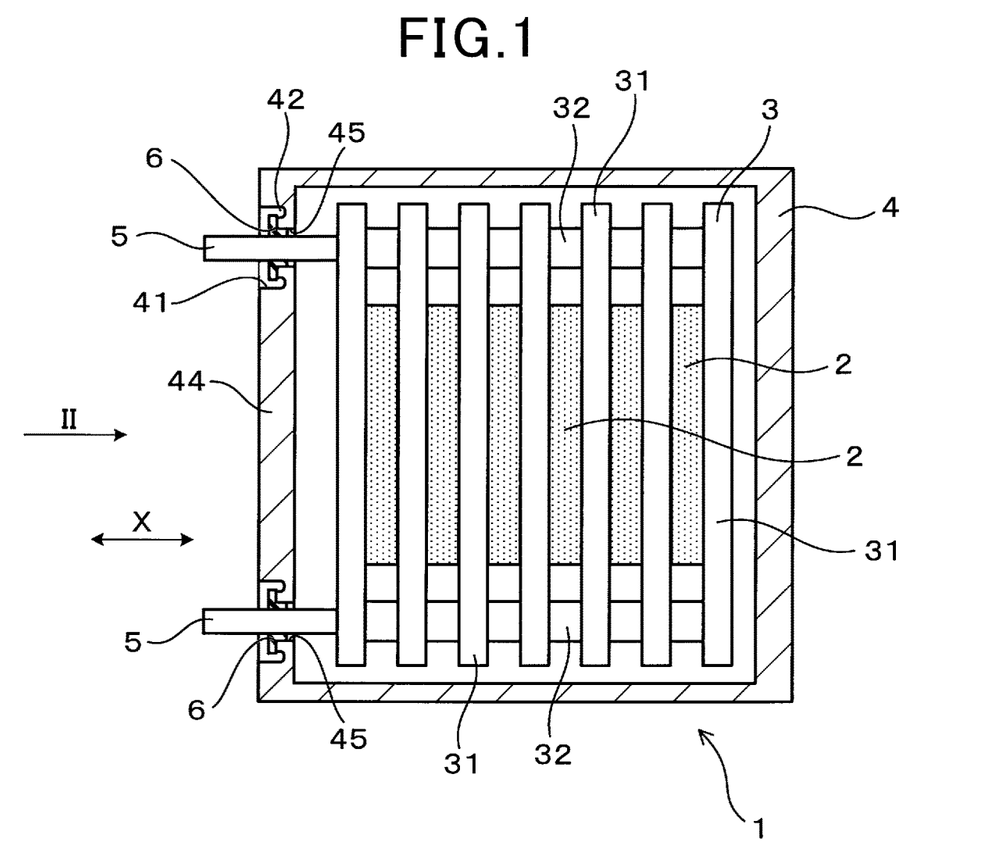
FIG. 1 is a sectional view illustrating a power conversion device according to a first embodiment.

As illustrated in FIG. 1, a power conversion device 1 according to the present embodiment includes semiconductor modules 2 used as electronic components, a cooler 3, a housing 4, protruding pipes 5, and annular seal members 6.

Figure 2:
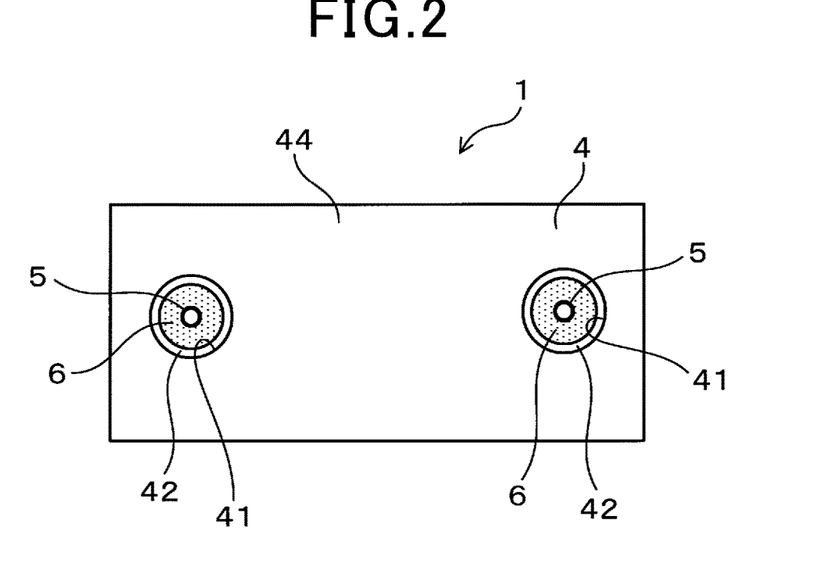
FIG. 2 is a diagram of the power conversion device in FIG. 1 as viewed from a direction of arrow II shown in FIG. 1.

The semiconductor modules 2 are electronic components constituting a part of the power conversion device. The cooler 3 cools the semiconductor modules 2. The housing 4 internally accommodates the semiconductor modules 2 and the cooler 3. As illustrated in FIG. 1 and FIG. 2, the protruding pipes 5 are connected to the cooler 3 and protrude outward of the housing 4. Each of the seal members 6 seals the gap between a corresponding one of the protruding pipes 5 and the housing 4.

Figure 3:
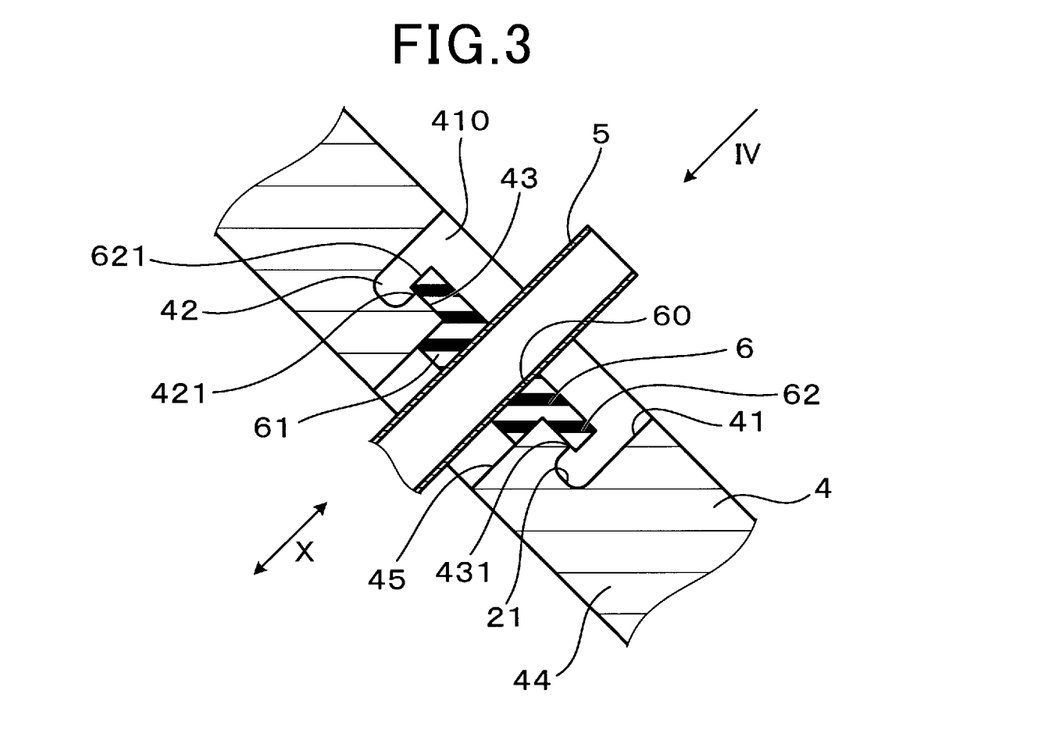
FIG. 3 is an enlarged sectional view of a periphery of a seal member according to the first embodiment.

As illustrated in FIG. 3, the seal member 6 includes a seal body portion 61 and a flange portion 62. The seal body portion 61 is a region interposed between the protruding pipe 5 and the housing 4. The flange portion 62 extends outward from the seal body portion 61 in a radial direction and contacts an outer surface of the housing 4 from an axial direction X.

Note that "radial direction" as used herein refers to the radial direction of the protruding pipe 5 unless otherwise specified. Additionally, "axial direction" as used herein refers to the axial direction of the protruding pipe 5 and the axial direction of the seal member 6.

The housing 4 includes a peripheral wall surface 41 formed to surround the flange portion 62 from an outer peripheral side and an annular groove portion 42 formed along an outer peripheral edge 621 of the flange portion 62 inside the peripheral wall surface 41.

The peripheral wall surface 41 is formed to extend outward, in the axial direction X, from an outer peripheral end 431 of an axial contact surface 43 corresponding to a surface contacted by the flange portion 62 of the housing 4.

The power conversion device 1 is mounted in, for example, an electric vehicle or a hybrid car and connected between a battery and an electric rotary machine. The power conversion device 1 converts DC power into AC power and vice versa. The housing 4 can be made of metal such as aluminum. As illustrated in FIG. 1, the housing 4 internally accommodates a plurality of the semiconductor modules 2 and the cooler 3 cooling the semiconductor modules 2. The cooler 3 includes a plurality of layered cooling pipes 31. The plurality of cooling pipes 31 and the plurality of semiconductor modules 2 are alternately layered.

The cooling pipes 31 adjacent to one another in a layering direction are coupled together by coupling pipes 32 near both ends of each pipe 31 in a longitudinal direction of the pipe 31. The two protruding pipes 5 are provided to protrude, in the layering direction, from the cooling pipe 31 disposed at one end in the layering direction. A refrigerant is introduced from one of the protruding pipes 5, flows through the cooler 3, and is discharge from the other protruding pipe 5. In the cooler 3, the refrigerant appropriately distributively flows through the plurality of cooling pipes 31 via the coupling pipes 32.

Thus, the refrigerant exchanges heat with the semiconductor modules 2 to allow the semiconductor modules 2 to be cooled. Each of the semiconductor modules 2 incorporates a switching element, for example, an IGBT (abbreviation for an insulated gate bipolar transistor) or a MOSFET (abbreviation for a metal oxide semiconductor field effect transistor). Additionally, the cooler 3 and the protruding pipes 5 are formed of metal, for example, aluminum.

The protruding pipes 5 are disposed penetrating one of wall portions 44 of the housing 4. The wall portion 44 is provided with two insertion holes 45 through which the respective protruding pipes 5 are inserted. The seal member 6 is interposed between each of the insertion holes 45 and the corresponding protruding pipe 5. Specifically, as illustrated in FIG. 3, the seal member 6 is disposed in close contact both with an outer peripheral surface of the protruding pipe 5 and with an inner peripheral surface of the insertion hole 45.

The seal member 6 is formed of an elastic member such as rubber. The seal member 6 includes the seal body portion 61, which is cylindrical, and the flange portion 62 protruding, toward an outer peripheral side, from the entire circumference of one end of the seal body portion 61 in an axial direction X.

The insertion hole 45 includes a recessed portion 410 formed on an outward open side of the housing 4 and corresponding to a receded part of the wall portion 44. The recessed portion 410 has a larger inner diameter than that of the insertion hole 45.

The seal body portion 61 of the seal member 6 is fitted in the insertion hole 45, and the flange portion 62 is disposed in the recessed portion 410. Additionally, the protruding pipe 5 is inserted through a center hole 60 penetrating the seal member 6 in the axial direction X. The flange portion 62 is in contact with the axial contact surface 43 forming a part of a bottom surface of the recessed portion 410. Additionally, as illustrated in FIG. 3 and FIG. 4, an inner peripheral surface of the recessed portion 410 is disposed opposite to and at a distance from an outer peripheral surface of the flange portion 62 (that is, the outer peripheral edge 621).

Specifically, the peripheral wall surface 41 is an inner peripheral surface of the recessed portion 410 formed on an outer surface of the housing 4. The annular groove portion 42 is formed on the bottom surface of the recessed portion 410. The annular groove portion 42 is annularly formed outward of the axial contact surface 43. Additionally, an outer peripheral edge of the annular groove portion 42 is formed smoothly continuously with the peripheral wall surface 41.

Figure 4:
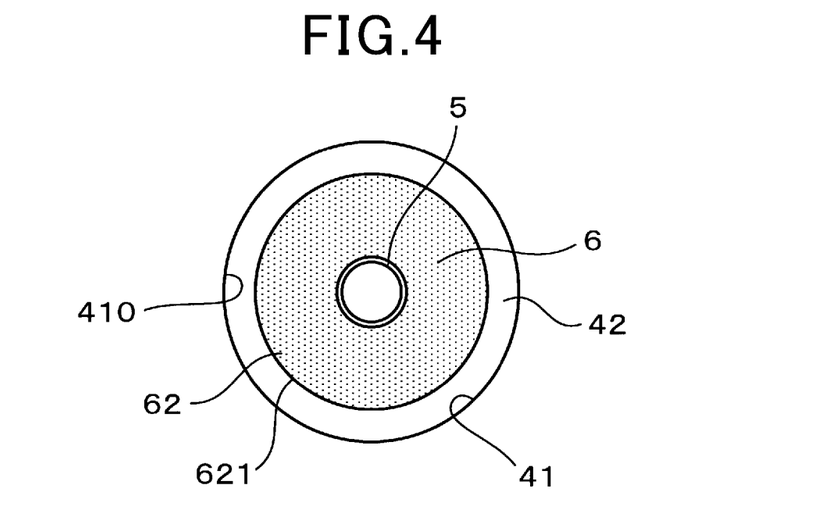
FIG. 4 is a diagram of the periphery of the seal member in FIG. 3 as viewed from a direction of arrow IV shown in FIG. 3.
Figure 5:
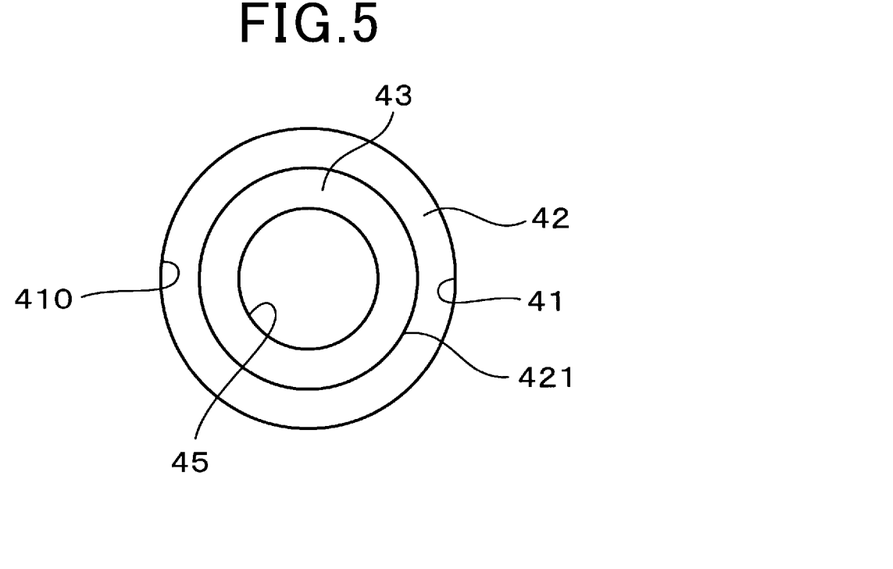
FIG. 5 is a plan view of a periphery of an insertion hole in a housing according to the first embodiment.

As illustrated in FIGS. 3 to 5, an inner peripheral edge 421 of the annular groove portion 42 is disposed inward from the outer peripheral edge 621 of the flange portion 62. This prevents the axial contact surface 43 of the housing 4 from adjoining an outer peripheral side of the outer peripheral edge 621 of the flange portion 62. Note that the outer peripheral edge 621 of the flange portion 62 only slightly protrudes toward the outer peripheral side beyond the inner peripheral edge 421 of the annular groove portion 42. The amount of protrusion of the outer peripheral edge 621 beyond the inner peripheral edge 421 is, for example, equal to or smaller than half of the width of the annular groove portion 42.

Additionally, in the present embodiment, the peripheral wall surface 41 is formed to extend axially outward from an outer end of the seal member 6 in the axial direction X. The seal member 6 as a whole is housed inside the recessed portion 410 and inside the insertion hole 45.

When mounted in a vehicle, the power conversion device 1 is disposed with the protruding pipes 5 facing upward or obliquely upward as illustrated in FIG. 3. In other words, a protruding direction of the protruding pipes 5 is opposite to the direction of gravity. In the present embodiment, the protruding direction of the protruding pipes 5 is inclined with respect to the direction of gravity.

Now, functions and effects of the present embodiment will be described below.

In the above-described power conversion device 1, the housing 4 includes the peripheral wall surface 41 formed to surround the flange portion 62 from the outer peripheral side. Thus, when the power conversion device 1 is externally wetted with water, the vicinity of a contact portion between the flange portion 62 of the seal member 6 and the housing 4 can be inhibited from being wetted with water. In other words, the outer peripheral end 431 of the axial contact surface 43 can be inhibited from being wetted with water.

For example, during a car washing or the like, high-pressure water can be inhibited from impinging directly on the outer peripheral edge 621 of the flange portion 62 or the outer peripheral end 431 of the axial contact surface 43. Accordingly, water can be inhibited from infiltrating between the axial contact surface 43 and the flange portion 62.

Additionally, the housing 4 includes the annular groove portion 42 formed along the outer peripheral edge 621 of the flange portion 62 inside the peripheral wall surface 41. Accordingly, even in a case where water reaches the inside of the peripheral wall surface 41, the water can be inhibited from being accumulated at the outer peripheral end 431 of the axial contact surface 43. In other words, when the water reaches the outer peripheral end 431 of the axial contact surface 43, the water can be caused to flow down into the annular groove portion 42. As a result, the water is less likely to be accumulated at the outer peripheral edge 621 of the flange portion 62.

Figure 6:
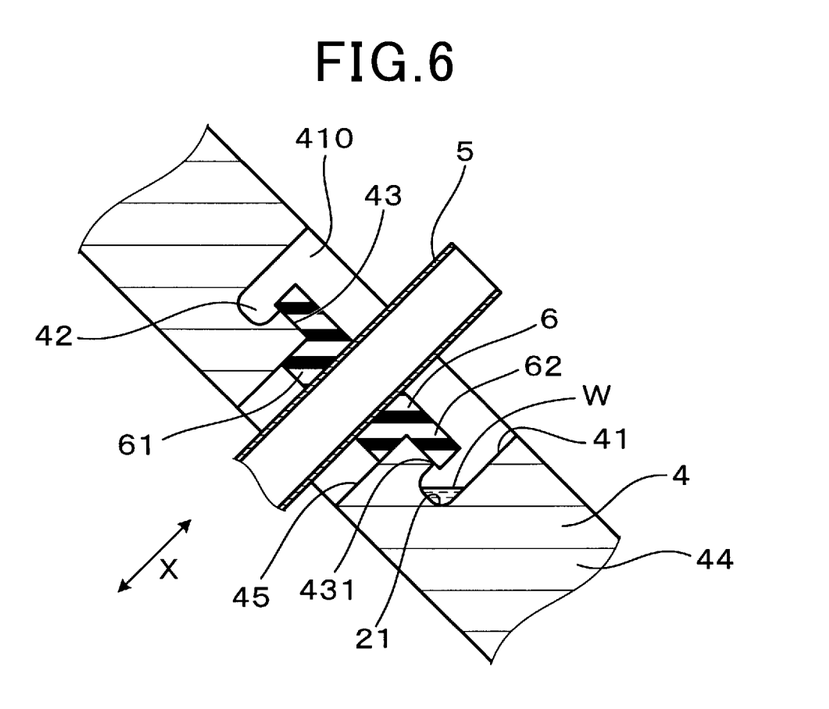
FIG. 6 is a diagram illustrating functions and effects of the first embodiment.

Specifically, as illustrated in FIG. 6, when the water reaches the outer peripheral end 431 of the axial contact surface 43, the water W drops down into the annular groove portion 42. Accordingly, the water can be prevented from accumulating at the outer peripheral end 431 of the axial contact surface 43.

Thus, the water can be effectively inhibited from infiltrating between the flange portion 62 and the axial contact surface 43 of the housing 4. In other words, the watertightness of the housing 4 can be improved.

The peripheral wall surface 41 is the inner peripheral surface of the recessed portion 410 formed on the outer peripheral surface of the housing 4, and the annular groove portion 42 is formed on the bottom surface of the recessed portion 410. This allows the peripheral wall surface 41 to be easily formed.

Additionally, the inner peripheral edge 421 of the annular groove portion 42 is disposed inward from the outer peripheral edge 621 of the flange portion 62. This allows water to be prevented from being retained at the outer peripheral edge 621 of the flange portion 62. Thus, the housing 4 can be prevented from corroding at the periphery of the outer peripheral edge 621 of the flange portion 62. As a result, water can be further reliably prevented from infiltrating into the housing 4.

As described above, according to the present embodiment, a power conversion device can be provided that can improve the watertightness of the housing.

Comparative Embodiment

Figure 7:
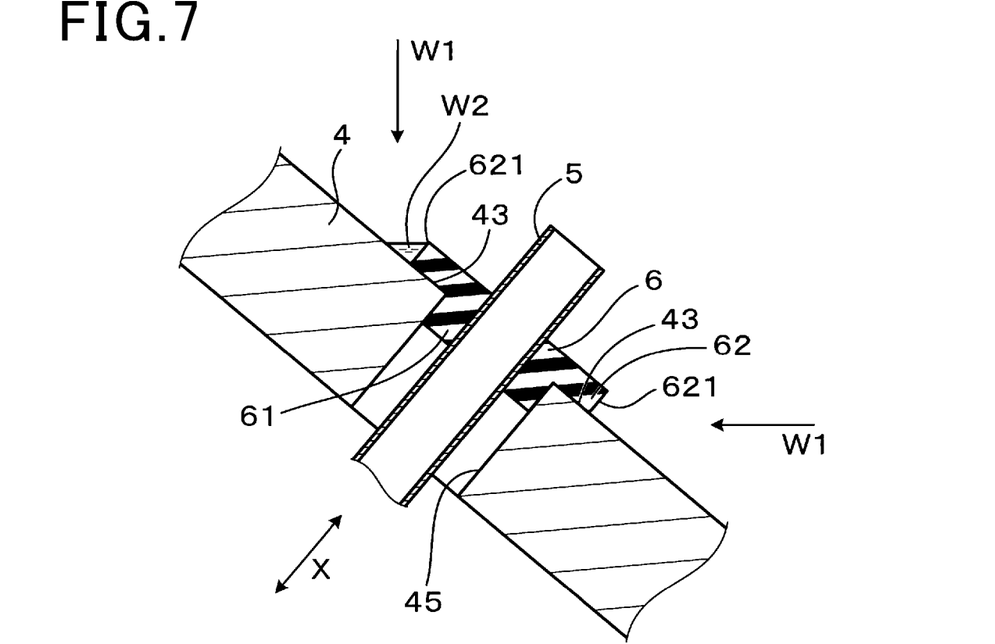
FIG. 7 is an enlarged sectional view of a periphery of a seal member in a comparative embodiment.

In the present comparative embodiment, a power conversion device will be described in which the housing 4 is not provided with the peripheral wall surface 41 or the annular groove portion 42 described in the first embodiment, as illustrated in FIG. 7. Note that, in the present and subsequent embodiments, the same reference symbols as those in the above-described embodiments represent components and the like that are similar to the components and the like in the above-described embodiments unless otherwise specified. However, the reference signs illustrated in the present comparative embodiment indicate portions corresponding to the portions of the power conversion device 1 in the first embodiment, and the portions may differ from the corresponding portions in configuration itself.

In the present comparative embodiment, the flange portion 62 is in contact with the outer surface of the housing 4 in the axial direction X. The flange portion 62 is not surrounded from the outer peripheral side. In this case, for example, high-pressure water W1 during car wash may impinge directly on the outer peripheral edge 621 of the flange portion 62 from the outer peripheral side. In that case, the water may infiltrate between the flange portion 62 and the axial contact surface 43 of the housing 4. In other words, the high-pressure water W1 may distort a part of the flange portion 62, and the water may infiltrate between the flange portion 62 and the axial contact surface 43.

Additionally, in a case where the protruding pipes 5 are disposed facing obliquely upward, water W2 may be accumulated in a portion between the outer peripheral edge 621 of the flange portion 62 and the outer surface of the housing 4. In this case, in a case where the accumulated water W2 is salt water or the like which contains corrosive components, the housing 4, which is made of metal, may corrode. Development of the corrosion may degrade the watertightness.

In contrast, the power conversion device 1 according to the first embodiment described above can inhibit the phenomenon as described above.

Second Embodiment

The present embodiment is an embodiment of the power conversion device 1 in which the housing 4 includes a communication groove 46 communicating with the annular groove portion 42 and extending toward the outer peripheral side beyond the peripheral wall surface 41 as illustrated in FIGS. 8 to 11.

Figure 8:
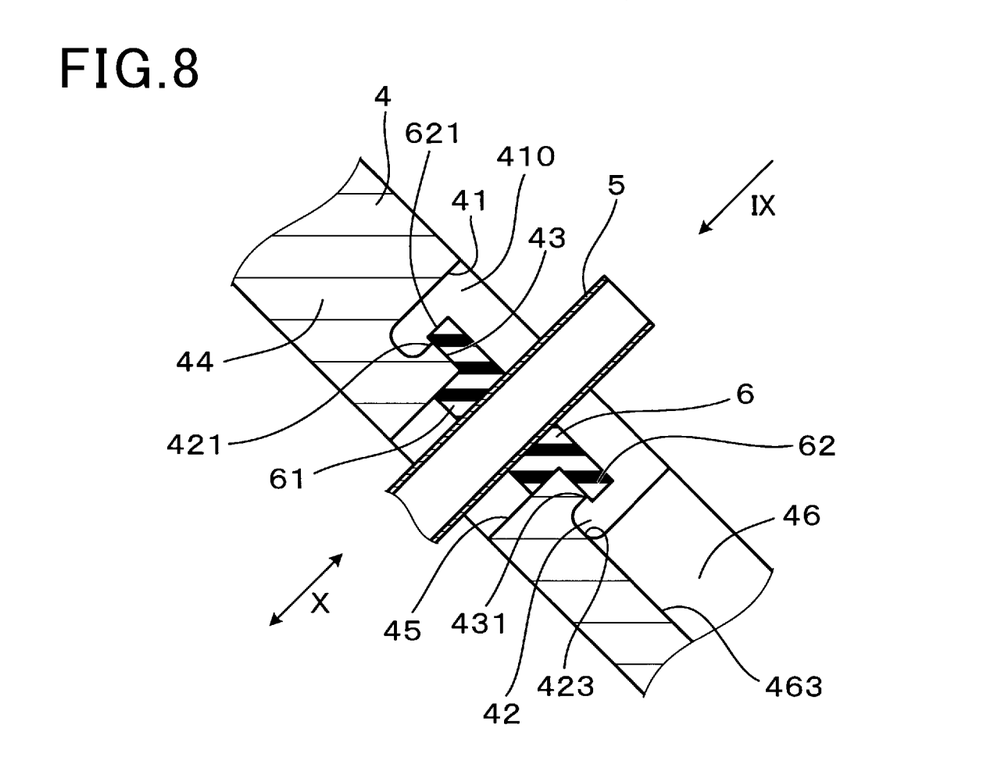
FIG. 8 is an enlarged sectional view of a periphery of a seal member according to a second embodiment.

The communication groove 46 is formed to extend outward from a part of an outer peripheral edge of the annular groove portion 42 in the radial direction. As illustrated in FIG. 8, at a portion of the communication groove 46 coupled to the annular groove portion 42, a bottom surface 463 of the communication groove 46 is formed substantially flush with a bottom surface 423 of the annular groove portion 42 in a depth direction. In FIG. 8, the width of the communication groove 46 is illustrated as being substantially constant in a longitudinal direction. However, the width of the communication groove 46 may vary. For example, the communication groove 46 may be formed to have a width decreasing with increasing distance from the annular groove portion 42.

Figure 9:
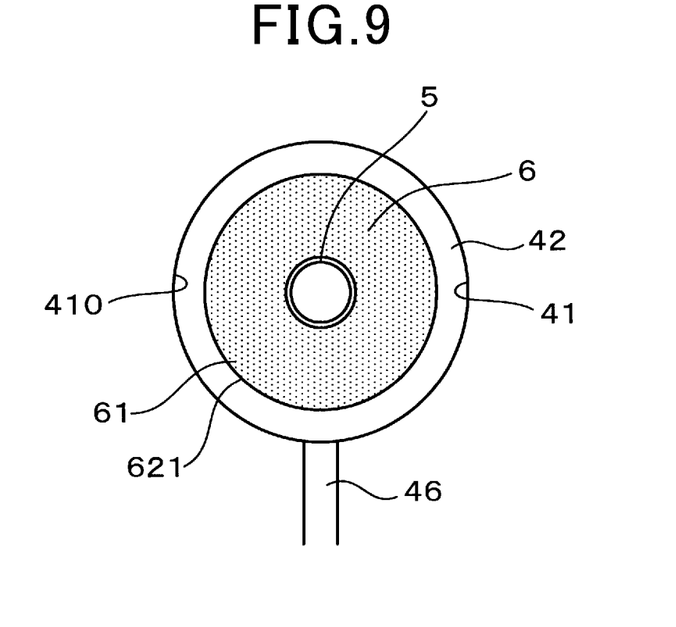
FIG. 9 is a diagram of the periphery of the seal member in FIG. 8 as viewed from a direction of arrow IX.
Figure 10:
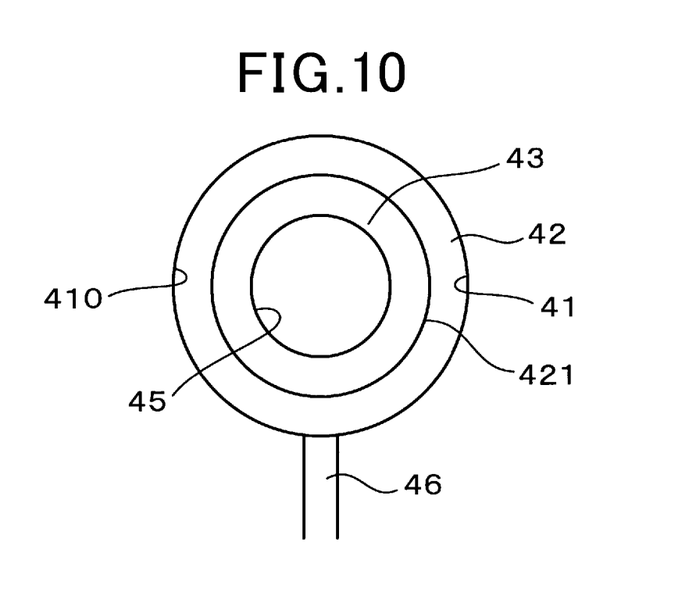
FIG. 10 is a plan view of a periphery of an insertion hole in a housing according to the second embodiment.
Figure 11:
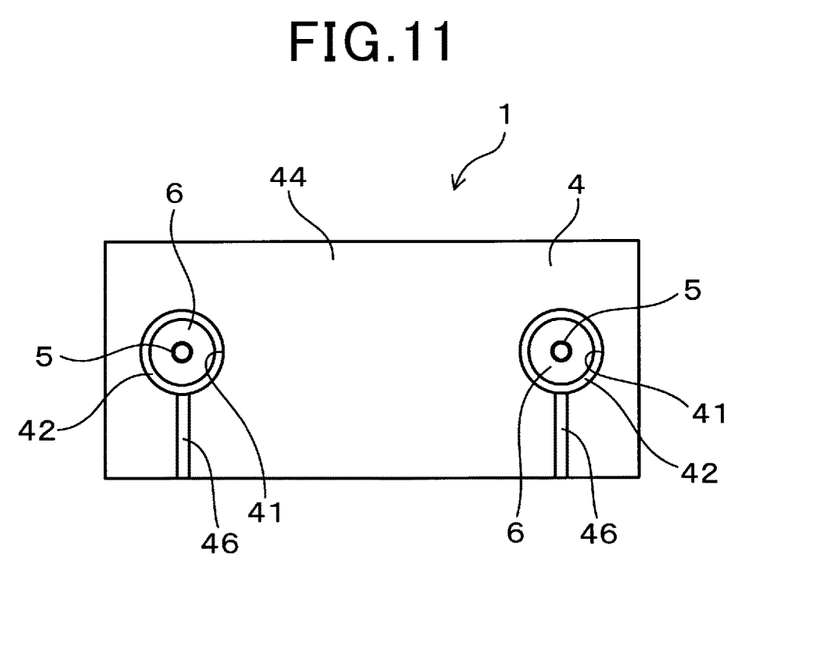
FIG. 11 is a front view of a power conversion device according to the second embodiment.

As illustrated in FIG. 9 and FIG. 10, the width of the communication groove 46 can be made smaller than the radius of the recessed portion 410. Additionally, the width of the communication groove 46 can be made smaller than the inner diameter of the protruding pipe 5.

Additionally, when mounted in a vehicle, the power conversion device 1 is disposed with the protruding pipes 5 facing obliquely upward as illustrated in FIG. 8. Furthermore, the power conversion device 1 is disposed with the bottom surface 463 of the communication groove 46 declining from the annular groove portion 42 toward the outer peripheral side.

The remaining part of the configuration is similar to the corresponding part of the first embodiment.

In the present embodiment, the housing 4 includes the communication groove 46 formed on communication with the annular groove portion 42. This allows water entering into the annular groove portion 42, to be discharged from the communication groove 46. Thus, the water can be prevented from accumulating in the annular groove portion 42. As a result, the watertightness of the housing 4 can be more reliably improved.

Otherwise the present embodiment provides functions and effects similar to the functions and effects of the first embodiment.

Third Embodiment

Figure 12:
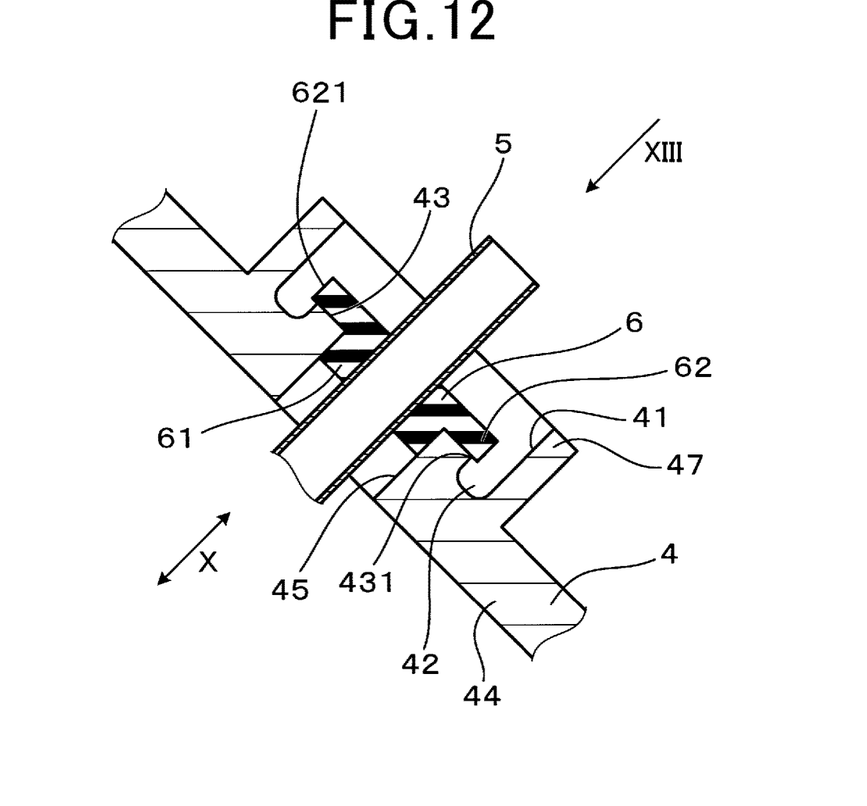
FIG. 12 is an enlarged sectional view of a periphery of a seal member according to a third embodiment.
Figure 13:
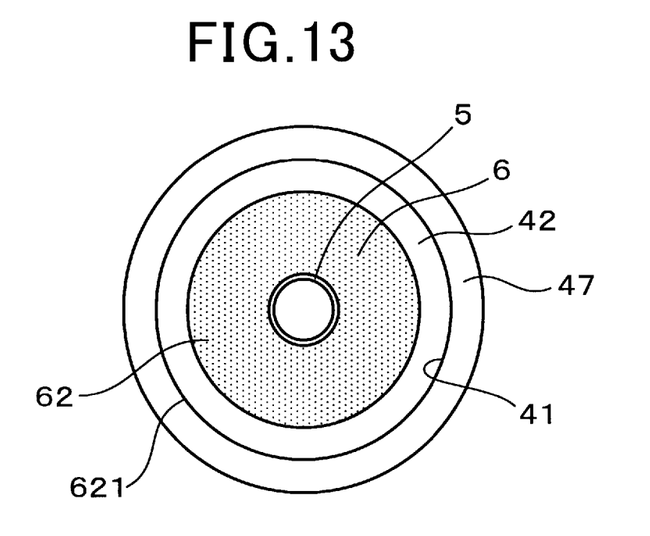
FIG. 13 is a diagram of the periphery of the seal member in FIG. 12 as viewed from a direction of arrow XIII shown in FIG. 12.

As illustrated in FIG. 12 and FIG. 13, the power conversion device 1 according to present embodiment includes an annular wall portion 47 located around the insertion hole 45 and protruding from the outer surface of the housing 4 in the axial direction X of the protruding pipes 5.

The peripheral wall surface 41 includes an inner peripheral surface of the annular wall portion 47. In other words, the annular wall portion 47 is formed to surround the flange portion 62 of the seal member 6 from the outer peripheral side. Thus, the inner peripheral surface of the annular wall portion 47 forms the peripheral wall surface 41 surrounding the flange portion 62 from the outer peripheral side.

The remaining part of the configuration is similar to the corresponding part of the first embodiment.

The present embodiment is useful in a case where the wall portion 44 of the housing 4 has a relatively small thickness.

Otherwise the present embodiment provides functions and effects similar to the functions and effects of the first embodiment.

Fourth Embodiment

Figure 14:
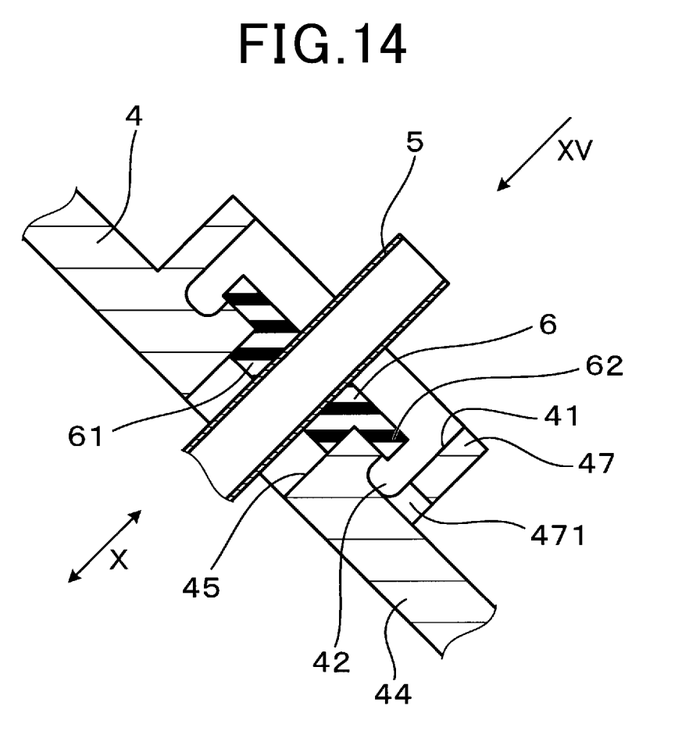
FIG. 14 is an enlarged sectional view of a periphery of a seal member according to a fourth embodiment.
Figure 15:
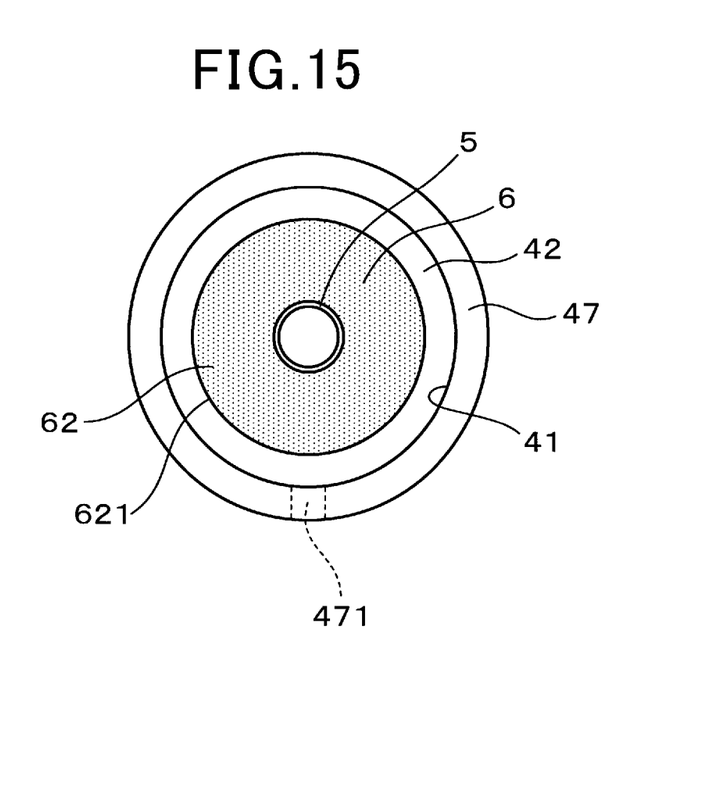
FIG. 15 is a diagram of the periphery of the seal member in FIG. 14 as viewed from a direction of arrow XV shown in FIG. 14.

As illustrated in FIG. 14 and FIG. 15, the power conversion device 1 according to the present embodiment includes a penetrating portion 471 formed on a part of the annular wall portion 47 in a circumferential direction and penetrating the annular wall portion 47 in the radial direction.

The penetrating portion 471 is formed on a part of the annular wall portion 47 located on a lower side in a case where the power conversion device 1 is mounted in a vehicle, as illustrated in FIG. 14. The penetrating portion 471 is formed to decline from the annular groove portion 42 side toward the outer peripheral side.

As illustrated in FIG. 15, the width of the penetrating portion 471 as viewed from the axial direction X can be made, for example, smaller than an inner peripheral radius of the annular wall portion 47. Alternatively, the width of the penetrating portion 471 as viewed from the axial direction X of the protruding pipes 5 can be made, for example, smaller than an inner diameter of each of the protruding pipe 5.

The remaining part of the configuration is similar to the corresponding part of the third embodiment.

In the present embodiment, water entering into the annular groove portion 42 can be discharged from the penetrating portion 471. Thus, the water can be prevented from accumulating in the annular groove portion 42. As a result, the watertightness of the housing 4 can be more reliably improved.

Otherwise the present embodiment provides functions and effects similar to the functions and effects of the first embodiment.

In the embodiments illustrated above, the inner peripheral edge 421 of the annular groove portion 42 is located inward from the outer peripheral edge 621 of the flange portion 62 of the seal member 6. However, for example, the inner peripheral edge 421 may be located at a position equivalent to the position of the outer peripheral edge 621 of the flange portion 62.

Further, in the above-described embodiments, the structure of the housing 4 and the shape of the seal member 6 around each protruding pipe 5 are similar for the two protruding pipes 5. However, such limitation is not necessarily intended. In other words, it is possible to employ the above-described structure only for the structure around one protruding pipe. For example, in a case where the two protruding pipes 5 differ from each other in protruding direction, with one of the protruding pipes 5 disposed facing obliquely downward or downward, employment of the above-described structure for the periphery of the obliquely downward or downward facing protruding pipe 5 can be omitted.

Furthermore, in the power conversion device 1 according to the second embodiment, instead of the communication groove 46, a communication passage may be formed that penetrates the inside of the wall portion 44 of the housing 4 and leads to the outside of the housing 4. Additionally, in the power conversion device 1 according to the fourth embodiment, instead of the penetrating portion 471, a slit may be formed by cutting out a part of the annular wall portion 47 in the axial direction X.

Additionally, in the above-described embodiments, the semiconductor modules are illustrated as the electronic components cooled by the cooler. However, no such limitation on the electronic components is intended, and other electronic components, for example, capacitors, reactors can be used.

The present disclosure is not limited to the above-described embodiments and can be applied to various embodiments without departing from the scope of the disclosure.

The present disclosure has been described in compliance with the embodiments, but it is understood that the present disclosure is not limited to the embodiments or structures. The present disclosure includes various modified examples and modifications within the range of equivalency. In addition, the scope of the present disclosure and the range of concepts of the present disclosure include various combinations or configurations and further include other combinations and configurations corresponding to addition of only one element, two or more elements, or a portion of one element to the above-described various combinations or configurations.

What is claimed is:

1. A power conversion device comprising:
an electronic component forming a part of the power conversion device;
a cooler cooling the electronic component;
a housing internally accommodating the electronic component and the cooler,
a protruding pipe connected to the cooler and protruding outward from the housing, and
an annular seal member sealing a gap between the protruding pipe and the housing, wherein
the seal member includes a seal body portion interposed between the protruding pipe and the housing and a flange portion extending outward from the seal body portion in a radial direction and contacting an outer surface of the housing from an axial direction of the protruding pipe,
the housing includes a peripheral wall surface formed surrounding the flange portion from an outer peripheral side and an annular groove portion formed along an outer peripheral edge of the flange portion inside the peripheral wall surface,
the peripheral wall surface is formed to extend outward from an outer peripheral end of an axial contact surface of the housing in the axial direction, the axial contact surface being contacted by the flange portion of the housing, and
the housing includes a communication groove communicating with the annular groove portion and extending toward an outer peripheral side beyond the peripheral wall surface.

2. The power conversion device according to claim 1, wherein
the peripheral wall surface is an inner peripheral surface of a recessed portion formed on the outer surface of the housing, and the annular groove portion is formed on a bottom surface of the recessed portion.

3. The power conversion device according to claim 1, wherein
the peripheral wall surface comprises an inner peripheral surface of an annular wall portion protruding from the outer surface of the housing in an axial direction of the protruding pipe.

4. The power conversion device according to claim 3, wherein
a penetrating portion is formed on a part of the annular wall portion to penetrate the annular wall portion in a radial direction.

5. The power conversion device according to claim 1, wherein
an inner peripheral edge of the annular groove portion is disposed inward from the outer peripheral edge of the flange portion.

* * * * *